United States Patent
Huang et al.

(10) Patent No.: US 6,255,023 B1
(45) Date of Patent: Jul. 3, 2001

(54) METHOD OF MANUFACTURING BINARY PHASE SHIFT MASK

(75) Inventors: Chien-Chao Huang, Kaohsiung; Michael W C Huang, Hsin-Tien; Juan-Yuan Wu, Hsinchu, all of (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/434,046

(22) Filed: Nov. 4, 1999

(51) Int. Cl.[7] .................................................. G03F 9/00

(52) U.S. Cl. ...................................................... 430/5

(58) Field of Search ................................ 430/5, 322, 323, 430/311, 313, 314, 394

(56) References Cited

U.S. PATENT DOCUMENTS 5,900,337 * 5/1999 Lee ............................................ 430/5

* cited by examiner

Primary Examiner—S. Rosasco
(74) Attorney, Agent, or Firm—Thomas, Kayden, Horstemeyer & Risley, LLP

(57) ABSTRACT

A method of manufacturing a binary phase shift photomask. A phase shift layer and a mask layer are sequentially formed over a transparent substrate. The mask layer and the phase shift layer are patterned to form a plurality of first openings and a plurality of second openings that expose a portion of the transparent substrate. The mask layer is patterned to form a layer of mask material around the edges of the first openings. All first openings occupy an area greater than a preset minimum area while all second openings occupy an area greater than the preset minimum area. The mask layer only surrounds the first openings while the phase shift layer surrounds both the first and the second openings.

21 Claims, 4 Drawing Sheets

METHOD OF MANUFACTURING BINARY PHASE SHIFT MASK

BACKGROUND OF THE INVENTION

1. Field of the Invention

The present invention relates to a photolithographic technique. More particularly, the present invention relates to a method of manufacturing a binary phase shift mask.

2. Description of the Related Art

Photolithography plays an important part in the manufacturing of semiconductors. Many processing operations such as etching and doping must go through photolithographic operations. In fact, the ultimate quality of most semiconductor devices depends on the resolution of light and depth of focus (DOF) in photolithography.

In the fabrication of semiconductors having a line width greater than 0.18 µm, a binary photomask consisting of a quartz plate with a plated chromium film pattern thereon is often used. In general, a moderate to high-quality pattern can be transferred to a photoresist layer using this type of photomask.

However, when semiconductor products having a line width smaller than 0.18 microns are fabricated, light diffraction due to the reduction of hole diameters and line width in the mask pattern dominates. To minimize diffraction, a phase shifting layer is added to the binary photomask. Utilizing the positive and negative interference of light through the phase shift layers, resulting resolution of the photomask is improved. This type of photomask that also has an added phase shift layer is called a phase shift mask (PSM). The advantage of a phase shift mask is that resolution is improved without the need to use a new light source. Only changes in the photomask are required. A half-tone PSM is a photomask formed using phase-shifting material capable of shifting the phase of light by 180°. In addition, the phase-shifting material is semi-transparent, and permits at most 30% of the light to pass through. In general, a portion of the pattern on the half-tone PSM is transparent. In other words, there is no phase shift through that area. Most phase shift materials contain molybdenum silicon oxy-nitride ($MoSi_zO_xN_y$) and chromium oxide. However, a pattern to be transferred to a photoresist layer generally contains some small and some large openings. Moreover, some of the small openings may come very close to some large ones, for example, the layout of local interconnects. Consequently, side-lobe effects are a common occurrence.

FIG. 1A is a schematic cross-sectional view of a conventional half-tone phase shift mask. As shown in FIG. 1A, a phase shift layer 110 is formed over a quartz substrate 100. The phase shift layer 110 has a smaller opening 120 and a larger opening 130.

FIG. 1B is a graph showing the variation of luminosity on a photoresist layer during light exposure for a mask having cross-section as shown in FIG. 1A. As shown in FIG. 1B, the photoresist layer receives more light from the larger opening 130. In addition, intensity of light coming from the edge of the opening 130 is also greater (that is, diffracted light leaking out from the edge of the opening 130). Conversely, the photoresist layer receives less light from the smaller opening 120 and corresponding intensity from the edge of the opening 120 is smaller.

Since diffracted light coming from the edge of the opening 120 is relatively small, phase-reversed light from the phase shift layer 110 has sufficient intensity to cancel out the diffracted light. However, diffracted light coming from the edge of the larger opening 130 is more intense; hence phase-shifted light from the phase shift layer 110 is only able to cancel a portion of the diffracted light. Therefore, a swath of light is still emitted from the edge of the opening 130. Residual light from diffraction causes the exposure of photoresist in unwanted areas. This phenomenon is the so-called side-lobe effect.

This is a difficult situation because neither increasing nor decreasing light exposure helps. If the period of exposure is decreased, the photoresist layer receives too little light from smaller openings such as the opening 120. On the other hand, if the period of exposure is increased so that the photoresist layer receives sufficient light from all the smaller openings, side-lobe effects occur in all the larger openings such as the opening 130.

SUMMARY OF THE INVENTION

The present invention is to provide a binary phase shift mask. The mask includes a transparent substrate, a phase shift layer and a mask layer. The phase shift layer is above the transparent substrate. The phase shift layer is a pattern with a plurality of first openings and a plurality of second openings. Both the first openings and the second openings expose a portion of the transparent substrate. The mask layer is above the phase shift layer. The mask layer is mainly a layer of mask material that surrounds the edges of all the first openings. All first openings occupy an area greater than a preset minimum area while the second openings all occupy an area smaller than the preset minimum area.

The invention provides a method of manufacturing a binary phase shift mask. A transparent substrate is first provided. A phase shift layer and a mask layer are sequentially formed over the transparent substrate. The mask layer and the phase shift layer are patterned to form a plurality of first openings and a plurality of second openings that expose a portion of the transparent substrate. The mask layer is patterned to form a layer of mask material that surrounds the edges of all first openings. All first openings occupy an area greater than a preset minimum area while the second openings all occupy an area smaller than the preset minimum area.

The binary phase shift photomask of the invention has a line of mask material next to the edges of the larger first openings. Hence, intensity of diffracted light passing through the edges of a large opening is greatly reduced. Therefore, lobe-side effects resulting from large first openings can be ameliorated so that all the advantages of a phase shift mask can be maintained.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
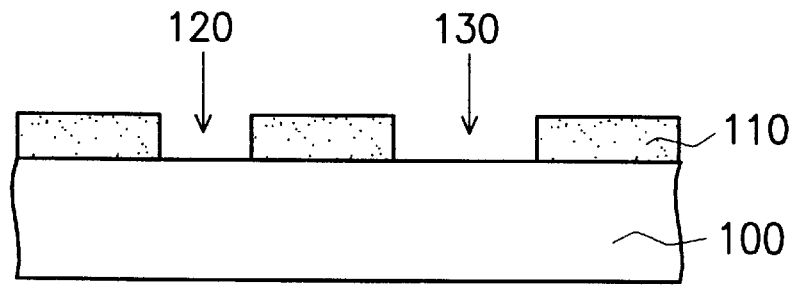
FIG. 1A is a schematic cross-sectional view of a conventional half-tone phase shift mask.
Figure 1B:
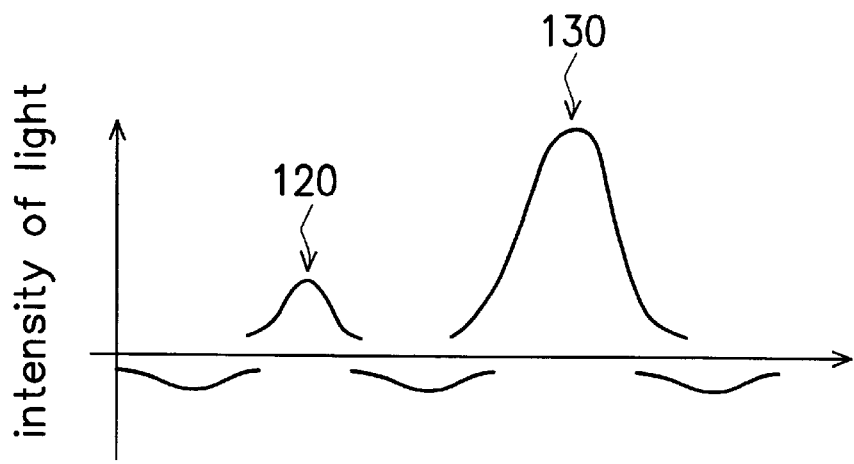
FIG. 1B is a graph showing the variation of luminosity on a photoresist layer during light exposure for a mask having a cross-section as shown in FIG. 1A.

Reference will now be made in detail to the present preferred embodiments of the invention, examples of which are illustrated in the accompanying drawings. Wherever possible, the same reference numbers are used in the drawings and the description to refer to the same or like parts.

In this invention, a line of mask material needs to be formed next to the edges of all larger openings so that light intensity around the edges of large openings is reduced to prevent lobe-side effects. The following is a brief description of the criteria and the methods a computer may use to select such openings.

Figure 2A:
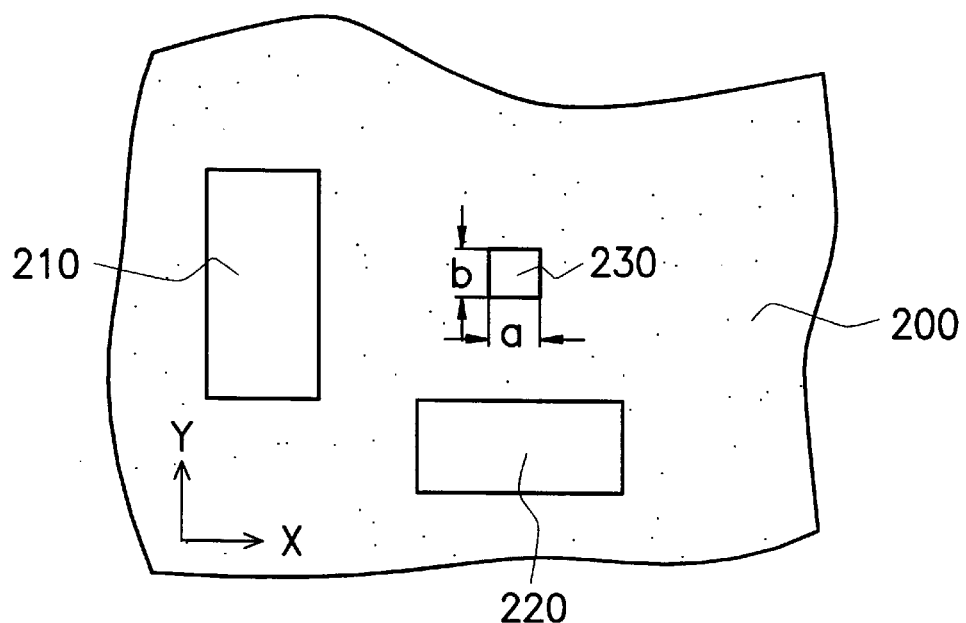
FIGS. 2A through 2C illustrate a series of pre-processing treatments of a photomask pattern according to one preferred embodiment of this invention.
Figure 2B:
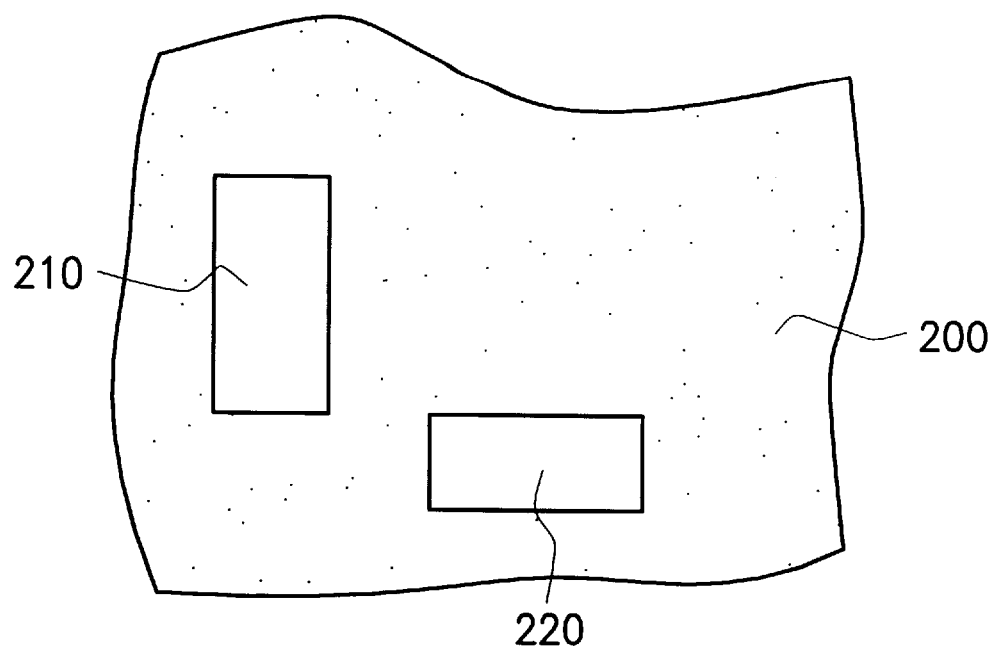
Figure 2C:
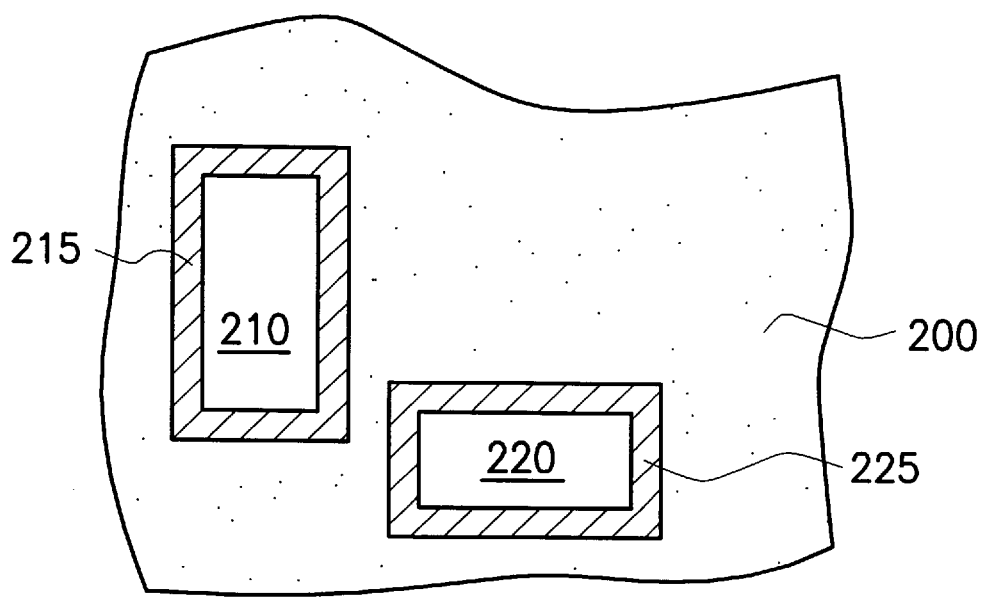

FIGS. 2A through 2C illustrate a series of pre-processing treatments of a photomask pattern according to one preferred embodiment of this invention. First, a particular layout as shown in FIG. 2A is needed on a phase shift region 200. The layout includes a pattern with, for example, three openings 210, 220 and 230. Openings 210 and 220 are larger while opening 230 is smaller. Assume that opening 230 is small enough so that a line of mask material around its edges is unnecessary, an off-the-shelf software package (for example, CATS or K2) can be used to aid the selection.

First, a pair of coordinate axis x and y is set up on the phase shift region 200. A preset smallest length a along the x-axis and a preset smallest length b along the y-axis are next fed into the computer. Alternatively, a preset smallest area a×b is directly fed into the computer. The computer program is then run to find all the openings whose length along the x-axis is smaller than a and length along the y-axis is smaller than b and then all those openings are removed from the layout. Similarly, if the smallest area criterion is used, openings with area smaller than a×b are all singled out and then removed from the layout accordingly. Ultimately, a pattern layout as shown in FIG. 2B is formed. A layout with the required mask layers 215 and 225 around the edges of the respective openings 210 and 220 is drawn as shown in FIG. 2C.

Figure 3A:
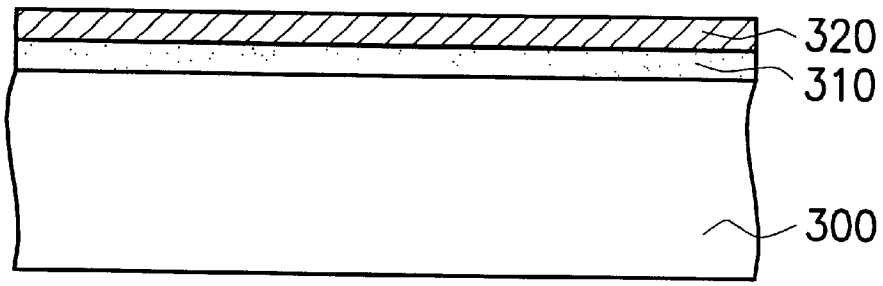
FIGS. 3A through 3C are schematic cross-sectional views illustrating the progression of steps for producing a binary phase shift mask according to the preferred embodiment of this invention.
Figure 3B:
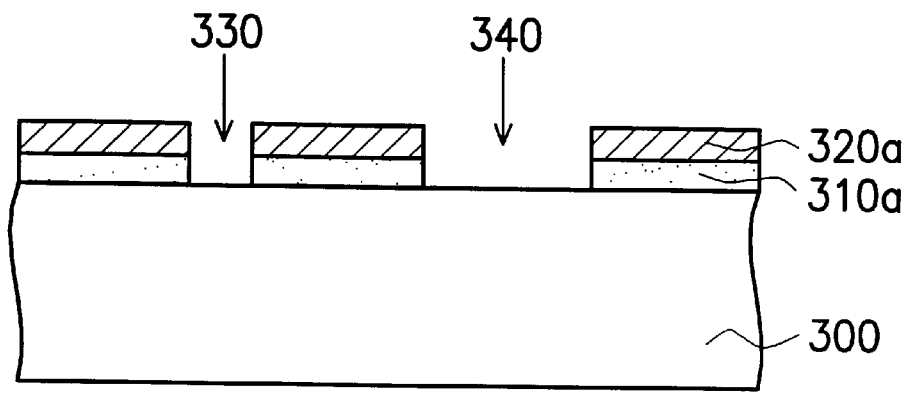
Figure 3C:
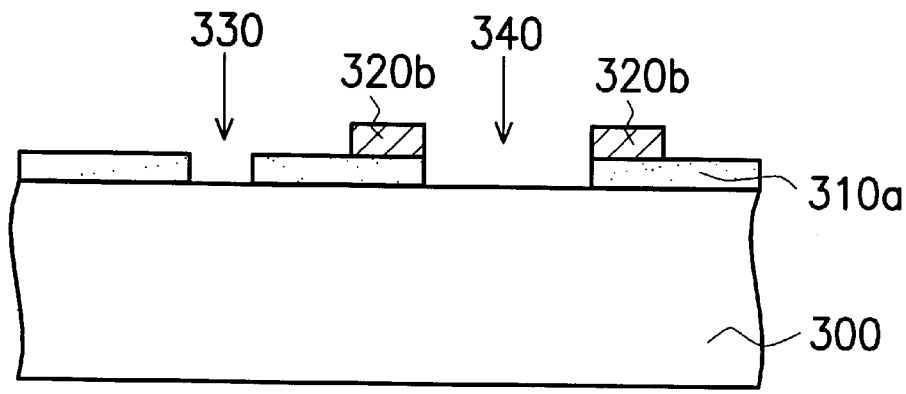

FIGS. 3A through 3C are schematic cross-sectional views illustrating the progression of steps for producing a binary phase shift mask according to the preferred embodiment of this invention.

First, as shown in FIG. 3A, a phase shift layer 310 and a mask layer 320 are sequentially formed over a transparent substrate 300. The transparent substrate 300 can be formed using, for example, quartz. The phase shift layer 310 can be formed using materials such as molybdenum silicon oxynitride ($MoSi_zO_xN_y$) or chromium oxide with a transparency preferably of between about 6% and 8%. The mask layer 320 can be formed using material such as chromium or aluminum.

As shown in FIG. 3B, the phase shift layer 310 and the mask layer 320 are patterned to form openings 330 and 340 that passes through a phase shift layer 310a and a mask layer 320a. The openings 330 and 340 are the transparent regions in the photomask.

If the opening 330 occupies an area smaller than a preset minimum area, there is no need to form a mask layer around the edge of the opening. Decision as to which openings needs a mask layer can be determined in a pre-processing step using a computer as shown in FIGS. 2A through 2C.

Figure 4:
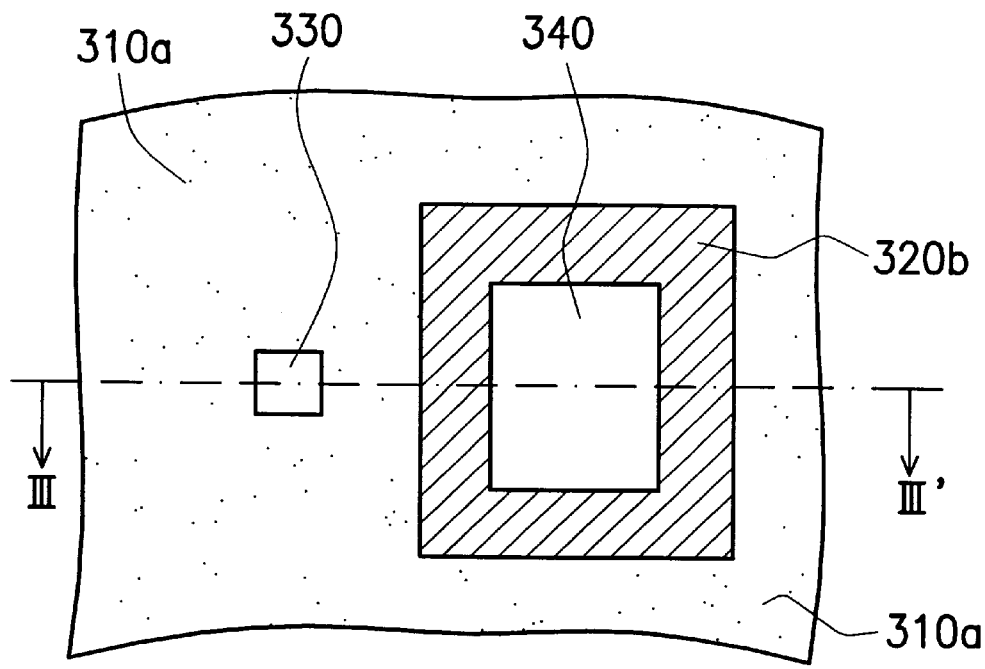
FIG. 4 is a top view of FIG. 3C.

As shown in FIG. 3C, the mask layer 320a is patterned to form a mask layer 320b according to a pre-determined mask pattern. In other words, only the opening 340 has a line of masking material 320b next to its edges. FIG. 4 is a top view of FIG. 3C. In fact, FIG. 3C is a cross-sectional view along line III–III' of FIG. 4. As shown in FIG. 4, openings 330 and 340 are transparent regions on the photomask. The phase shift layer 310a covers other regions of the photomask whereas a swath of mask layer 320b is on top of the phase shift layer 310a next to the edges of the opening 340.

Figure 5:
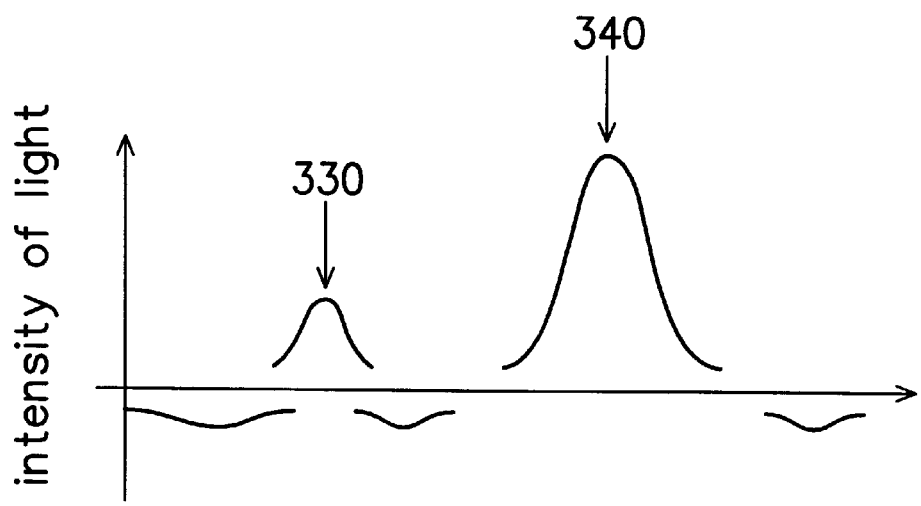
FIG. 5 is a graph showing the variation of luminosity on a photoresist layer during light exposure for a mask having cross-section as shown in FIG. 3C.

In a photolithographic operation, light from a light source is beamed onto a photoresist layer through the photomask (shown in FIGS. 3C and 4). FIG. 5 is a graph showing the variation of luminosity on a photoresist layer during light exposure for a mask having cross-section as shown in FIG. 3C. As shown in FIG. 5, due to the presence of a mask layer 320b around the edges of the larger opening 340, diffraction along the edges of the opening 340 is greatly reduced. Furthermore, the smaller opening 330 has less diffraction along its edges. Hence, the phase shift layer 310a alone can provide sufficient interference to cancel all the light due to diffraction. In summary, the binary phase shift photomask of this invention is able to provide sufficient luminosity for smaller openings and reduce lobe-side effects around larger openings at the same time.

By the addition of a mask layer over a half-tone phase shift photomask, problems due to a need for different light exposure time between large and small openings are eliminated. Moreover, mask patterns can be generated by simple computer software, and hence are compatible with the current fabrication process for half-tone PSM.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A binary phase shift photomask, comprising:
    a transparent substrate;
    a patterned phase shift layer over the transparent substrate, wherein the patterned phase shift layer includes a plurality of first openings and a plurality of second openings that expose a portion of the transparent substrate, the phase shift layer is semi-transparent, and all the first openings occupy an area greater than a preset minimum area while all the second openings occupy an area smaller than the preset minimum area; and
    a patterned mask layer over the phase shift layer, wherein the patterned mask layer surrounds edges of all the first openings.

2. The photomask of claim 1, wherein light transparency of the phase shift layer is about 6% to 8%.

3. The photomask of claim 1, wherein the phase shift produced by the phase shift layer is 180°.

4. The photomask of claim 1, wherein material for forming the substrate includes quartz.

5. The photomask of claim 1, wherein material for forming the phase shift layer includes chromium oxide.

6. The photomask of claim 1, wherein material for forming the phase shift layer includes molybdenum silicon oxy-nitride.

7. The photomask of claim 1, wherein material for forming the mask layer includes chromium.

8. A binary phase shift photomask, comprising:

a transparent substrate, wherein the transparent substrate has a plurality of first transparent regions, a plurality of second transparent regions, a plurality of phase shift regions and a plurality of mask regions, the mask regions surround the first transparent regions, and all the first transparent regions occupy an area greater than a preset minimum area while all the second transparent regions occupy an area smaller than the preset minimum area;

a phase shift layer in the phase shift regions and the mask regions above the transparent substrate, wherein the phase shift layer is semi-transparent; and a mask layer in the mask regions above the phase shift layer.

9. The photomask of claim 8, wherein light transparency of the phase shift layer is about 6% to 8%.

10. The photomask of claim 8, wherein the phase shift produced by the phase shift layer is 180°.

11. The photomask of claim 8, wherein material for forming the substrate includes quartz.

12. The photomask of claim 8, wherein material for forming the phase shift layer includes chromium oxide.

13. The photomask of claim 8, wherein material for forming the phase shift layer includes molybdenum silicon oxy-nitride.

14. The photomask of claim 8, wherein material for forming the mask layer includes chromium.

15. A method of manufacturing binary phase shift photomask, comprising the steps of:

providing a transparent substrate;

forming a phase shift layer over the transparent substrate, wherein the phase shift layer is semi-transparent;

forming a mask layer over the phase shift layer;

patterning the mask layer and the phase shift layer to form a plurality of first openings and a plurality of second openings that expose a portion of the transparent substrate, and all the first transparent regions occupy an area greater than a preset minimum area while all the second transparent regions occupy an area smaller than the preset minimum area; and patterning the mask layer to form a remaining mask layer around the edges of all the first openings.

16. The method of claim 15, wherein light transparency of the phase shift layer is between about 6% and 8%.

17. The method of claim 15, wherein the phase shift produced by the phase shift layer is 180°.

18. A binary phase shift photomask, comprising:

a transparent substrate;

a patterned phase shift layer over the transparent substrate having a light transparency of about 6% to 8% and producing a phase shift of 180°, wherein the patterned phase shift layer includes a plurality of first openings and a plurality of second openings that expose a portion of the transparent substrate, the phase shift layer is semi-transparent, and all the first openings occupy an area greater than a preset minimum area while all the second openings occupy an area smaller than the preset minimum area; and a patterned metal layer over the phase shift layer, wherein the patterned metal layer surrounds edges of all the first openings.

19. The photomask of claim 18, wherein material for forming the phase shift layer includes chromium oxide.

20. The photomask of claim 18, wherein material for forming the phase shift layer includes molybdenum silicon oxy-nitride.

21. A method of manufacturing binary phase shift photomask, comprising the steps of:

providing a transparent substrate;

forming a phase shift layer over the transparent substrate, wherein the phase shift layer is semi-transparent with a light transparency between about 6% and 8%, and wherein a phase shift produced by the phase shift layer is 180°;

forming a metal layer over the phase shift layer;

patterning the metal layer and the phase shift layer to form a plurality of first openings and a plurality of second openings that expose a portion of the transparent substrate, and all the first transparent regions occupy an area greater than a preset minimum area while all the second transparent regions occupy an area smaller than the preset minimum area; and patterning the metal layer to form a remaining metal layer around the edges of all first openings.

* * * * *